United States Patent
Gan (10) Patent No.: US 10,644,010 B2
(45) Date of Patent: May 5, 2020

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Zheng Hao Gan, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/683,226

(22) Filed: Aug. 22, 2017

(65) Prior Publication Data

US 2018/0061846 A1    Mar. 1, 2018

(30) Foreign Application Priority Data

Aug. 29, 2016 (CN) .......................... 2016 1 0753384

(51) Int. Cl.
*H01L 27/11* (2006.01)
*H01L 27/112* (2006.01)
(Continued)

(52) U.S. Cl.
CPC ............... *H01L 27/11206* (2013.01); *H01L 21/823431* (2013.01); *H01L 23/5256* (2013.01); *H01L 27/0886* (2013.01); *H01L 29/7851* (2013.01)

(58) Field of Classification Search
CPC ....... H01L 27/11206; H01L 21/823431; H01L 29/7851; H01L 23/5256; H01L 27/0886; H01L 29/785

See application file for complete search history.

(56) References Cited

U.S. PATENT DOCUMENTS 6,339,250 B1 *  1/2002  Ido ...................... H01L 23/5258
                                                              257/50
2003/0132503 A1 *  7/2003  Yang ................... H01L 23/5258
                                                              257/529

(Continued)

OTHER PUBLICATIONS

The European Patent Office (EPO) The Extended European Search Report for 17186865.6 dated Feb. 13, 2018 8 Pages.

*Primary Examiner* — Charles D Garber
*Assistant Examiner* — S M Sohel Imtiaz
(74) *Attorney, Agent, or Firm* — Anova Law Group, PLLC (57) ABSTRACT

Semiconductor devices and fabrication methods thereof are provided. An exemplary semiconductor device includes at least one FinFET device. The FinFET device includes a substrate, a plurality of fins protruding from the substrate, at least one gate structure on the substrate and across the plurality of fins by covering portions of side and top surfaces of the plurality of fins, and source/drain regions formed in the plurality of fins at two sides of the gate structure. The semiconductor device also includes a Fuse device formed above the FinFET device. The Fuse device includes a positive terminal and a negative terminal. The negative terminal is electrically connected to at least one source region of the FinFET device and the positive terminal is electrically connected to an external pad. Further, the semiconductor device also includes a dielectric layer formed between the FinFET device and the Fuse device.

19 Claims, 4 Drawing Sheets

(51) Int. Cl.
*H01L 21/8234* (2006.01)
*H01L 27/088* (2006.01)
*H01L 23/525* (2006.01)
*H01L 29/78* (2006.01)

(56) References Cited

U.S. PATENT DOCUMENTS

| | | | |
|---|---|---|---|
| 2008/0007986 A1* | 1/2008 | Jeong | G11C 17/16 365/96 |
| 2010/0244144 A1* | 9/2010 | Hsueh | H01L 23/5256 257/379 |
| 2010/0301417 A1 | 12/2010 | Cheng et al. | |
| 2010/0320561 A1* | 12/2010 | Xia | H01L 23/5256 257/529 |
| 2012/0132995 A1* | 5/2012 | Cheng | H01L 23/5256 257/363 |
| 2012/0278776 A1* | 11/2012 | Lei | H01L 21/823821 716/111 |
| 2013/0105895 A1 | 5/2013 | Liang et al. | |
| 2013/0140586 A1* | 6/2013 | Takahashi | H01L 29/1608 257/77 |
| 2013/0153960 A1* | 6/2013 | Yang | H01L 23/5252 257/183 |
| 2014/0016394 A1 | 1/2014 | Chung | |
| 2014/0346603 A1* | 11/2014 | Toh | H01L 27/11206 257/350 |
| 2014/0353796 A1* | 12/2014 | Lavoie | H01L 28/00 257/529 |
| 2015/0003142 A1* | 1/2015 | Chung | G11C 29/027 365/96 |
| 2015/0200196 A1* | 7/2015 | Ponoth | H01L 23/5252 257/379 |
| 2016/0071582 A1* | 3/2016 | Chung | G11C 11/1675 365/96 |
| 2016/0141179 A1* | 5/2016 | Wu | H01L 21/28088 257/288 |
| 2017/0053931 A1* | 2/2017 | Yamamoto | H01L 21/26513 |
| 2018/0061757 A1* | 3/2018 | Li | H01L 23/5256 |

\* cited by examiner

SEMICONDUCTOR DEVICE AND FABRICATION METHOD THEREOF

CROSS-REFERENCES TO RELATED APPLICATIONS

This application claims the priority of Chinese patent application No. 201610753384.3, filed on Aug. 29, 2016, the entirety of which is incorporated herein by reference.

FIELD OF THE DISCLOSURE

The present invention generally relates to the field of semiconductor manufacturing technologies and, more particularly, relates to semiconductor devices and fabrication methods thereof.

BACKGROUND

With the continuous development of the miniaturization and the complexity of semiconductor processes, semiconductor devices have become easier to be affected by various defects and impurities. The failures of individual lines, diodes and/or transistors often create defects in an entire chip. To solve such a problem, fuses are often included in integrated circuits (ICs) to increase the yield of IC products.

Currently, the commonly used fuse structures in ICs are electrically programmable fuse (Efuse) structures. The Efuse structures have a relatively high compatibility with the complementary metal oxide semiconductor (CMOS) structures. Further, the operation of the Efuse structures is relatively simple; the volume of the Efuse structures is relatively small; and the flexibility of the Efuse structures is relatively high. Thus, the Efuse structures are widely used in the ICs. For example, the Efuse structures can be used as one-time programmable (OTP) memory.

However, the performance of the existing Efuse structures needs further improvements. The disclosed methods and semiconductor structures are directed to solve one or more problems set forth above and other problems in the art.

BRIEF SUMMARY OF THE DISCLOSURE

One aspect of the present disclosure includes a semiconductor device. The semiconductor device may include at least one FinFET device. The FinFET device includes a substrate, a plurality of fins protruding from the substrate, at least one gate structure on the substrate and across the plurality of fins by covering portions of side and top surfaces of the plurality of fins, and source/drain regions formed in the plurality of fins at two sides of the gate structure. The semiconductor device also includes a Fuse device formed above the FinFET device. The Fuse device includes a positive terminal and a negative terminal. The negative terminal is electrically connected to at least one source region of the FinFET device and the positive terminal is electrically connected to an external pad. Further, the semiconductor device also includes a dielectric layer formed between the FinFET device and the Fuse device.

Another aspect of the present disclosure includes a method for fabricating a semiconductor device. The method includes forming at least one FinFET device. The FinFET device includes a substrate, a plurality of fins protruding from the substrate, at least one gate structure on the substrate and across the plurality of fins by covering portions of side and top surfaces of the plurality of fins, and source/drain regions formed in the plurality of fins at two sides of the gate structure. The method also includes forming a dielectric layer over the FinFET device. The dielectric layer is on the gate structure, the source/drain regions of the FinFET device. Further, the method includes forming a Fuse device above the FinFET device. The Fuse device includes a negative terminal and a positive terminal. The negative terminal is electrically connected to at least one source region of the FinFET device; and the dielectric layer is between the FinFET device and the Fuse device. Further, the method also includes forming an external pad. The external pad is electrically connected with the positive terminal.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
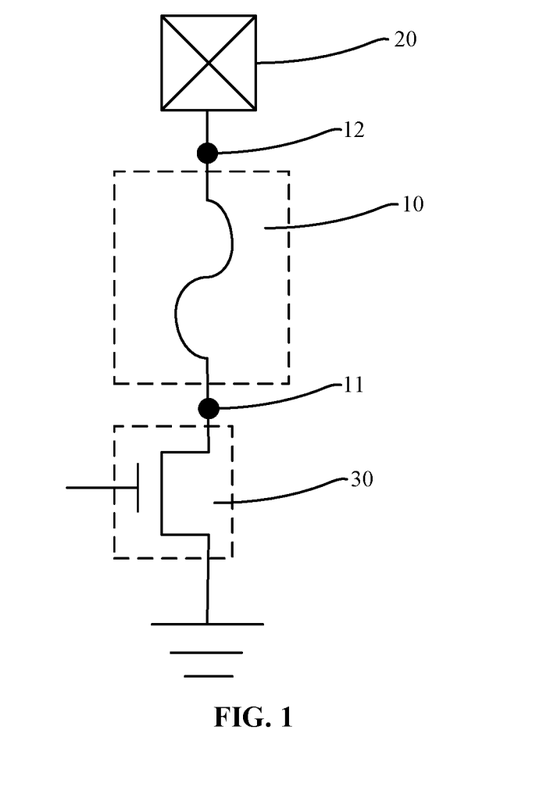
FIG. 1 illustrates an Efuse cell.

FIG. 1 illustrates an Efuse cell. As shown in FIG. 1, the Efuse cell includes a fuse 10. The fuse 10 has a negative electrode 11 and a positive electrode 12. Further, the Efuse cell also includes a soldering pad 20. The soldering pad 20 is connected to the positive electrode 12. Further, the Efuse cell also includes a programmable transistor 30. The source of the programmable transistor 30 is connected to the negative electrode 11 of the fuse 10. The drain of the programmable transistor 30 is connected to ground.

In the layout design of the Efuse cell, the programmable transistor 30 is put next to the fuse 10. However, the time for fusing the fuse 10 of such an Efuse cell may be relatively long. The programming time of the Efuse cell may be relatively long; and the programming efficiency may be relatively low.

The present disclosure provides semiconductor devices and fabrication methods thereof. A semiconductor device may include at least one FinFET device. The FinFET device may include a substrate, a plurality of fins protruding from the substrate, at least one gate structure formed on the substrate and across the plurality of fins by covering the portions of the top and side surfaces of the plurality of fins, and source/drain regions formed in the fins at two sides of the gate structure. The semiconductor structure may also include a Fuse device formed over the FinFET device. The Fuse device may have a positive terminal and a negative terminal. The negative terminal of the Fuse may be connected to at least one source region of the FinFET device. The positive terminal of the Fuse device may be connected to an external pad. Further, the semiconductor device may also include a dielectric layer formed between the FinFET device and the Fuse device.

In the disclosed semiconductor device, the FinFET device may be used as the programming transistor of the Fuse device; and the heat generated inside the FinFET device caused by a self-heating effect may provide heat to the Fuse device. The time for fusing the Fuse device may be reduced. Accordingly, the programming time of the semiconductor device may be significantly reduced; and the electrical properties of the semiconductor device may be enhanced.

Figure 2:
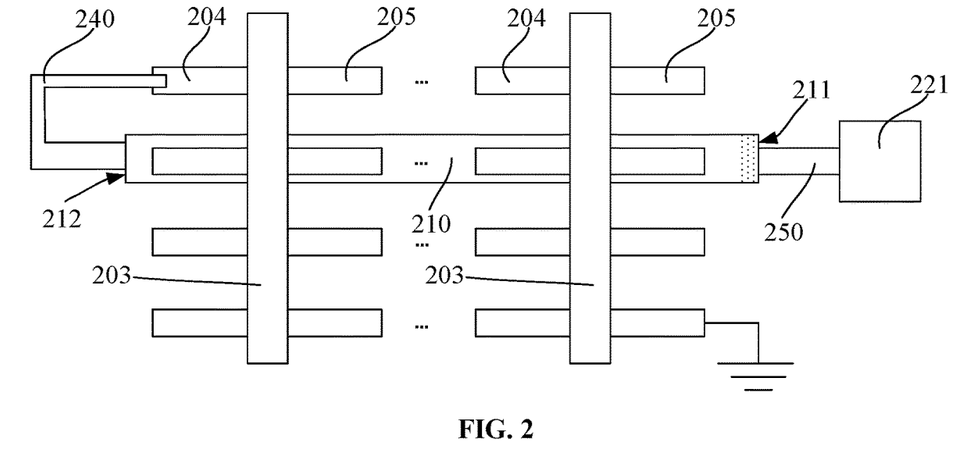
FIG. 2 illustrates a top view of an exemplary semiconductor device consistent with the disclosed embodiments.
Figure 3:
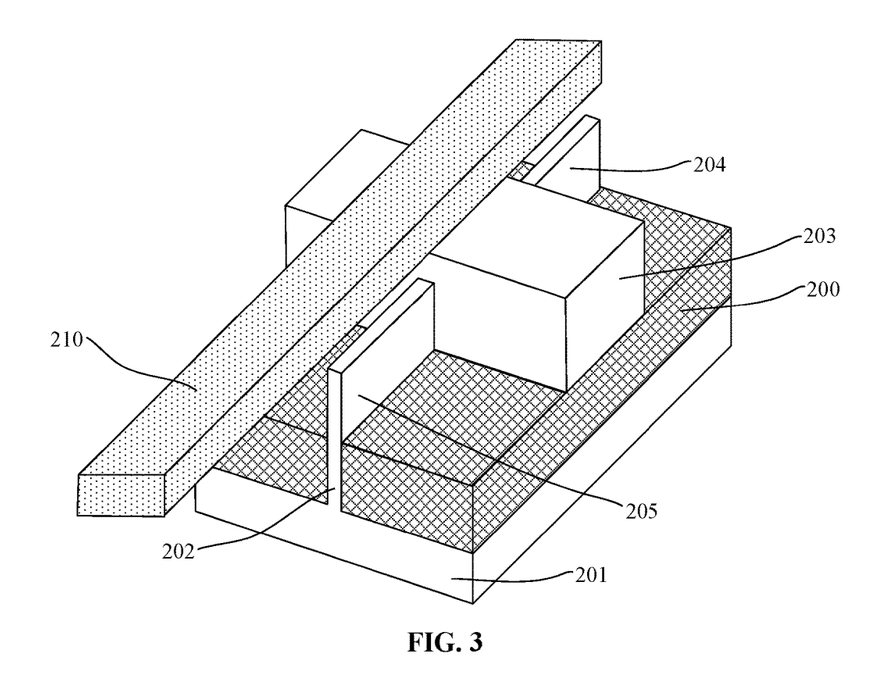
FIG. 3 illustrates a three-dimensional view of a portion of an exemplary semiconductor device consistent with the disclosed embodiments.

FIGS. 2-3 illustrate an exemplary semiconductor device consistent with the disclosed embodiments. FIG. 2 is a top view of the exemplary semiconductor device; and FIG. 3 is a three-dimensional view of a portion of the semiconductor device illustrated in FIG. 2.

As shown in FIGS. 2-3, the semiconductor device may include at least one FinFET device. The FinFET device may include a substrate 201, a plurality of fins 202 protruding from the substrate 201, at least one gate structure 203 formed over the substrate 201 and across the plurality of fins 202 by covering portions of the side and top surfaces of the fins 202; and source regions 204 and drain regions 205 formed in the fins 202 at two sides of the gate structure 203. For illustrative purposes, two gate structures 203 are shown in FIG. 2.

Further, the semiconductor device may also include at least one Fuse device formed above the FinFET device. The Fuse device may have a positive terminal 211 and a negative terminal 212. The positive terminal 211 may be electrically connected to an external pad 221. The negative terminal 212 may be electrically connected to at least one source region of the FinFET device.

Further, the semiconductor device may also include a dielectric layer (not shown) formed between the Fuse device and the FinFET device.

The number of the FinFET devices may be equal to, or greater than one. When the number of the FinFET devices is greater than one, the Fuse device may be above any FinFET device, or be across a plurality of FinFET devices. When the Fuse device is across the plurality of FinFET devices, the total heat generated by the plurality of FinFET devices caused by the self-heating during the operation state may be relatively high. Thus, the Fuse device may have a sufficiently high heating temperature; and the fusing efficiency of the Fuse device may be improved.

In one embodiment, for illustrative purposes, the number of the FinFET devices is greater than one. The plurality of fins 202 may be parallel to each other; and the plurality of fins 202 may share a same gate structure 203. Thus, each gate structure 203 may be across a plurality of fins 202. Further, the drain region 205 of at least one FinFET device may be connected to ground.

To avoid an unnecessary electrical connection between adjacent fins 202, an isolation structure 200 may be formed on the substrate 201. The isolation structure 200 may be on portions of the side surfaces of the fins 202; and the top surface of the isolation structure 200 may be below the top surfaces of the fins 202. Correspondingly, the gate structures 203 may be on the isolation structure 200; and may be across the fins 202.

In one embodiment, the Fuse device may be a metal layer formed above the FinFET device. The metal layer 210 may have two terminals. One terminal of the metal layer 210 may be referred to as the positive terminal 211; and the other terminal of the metal layer 210 may be referred to as the negative terminal 212.

In one embodiment, a direction from the positive terminal 211 to the negative terminal 212 may be parallel to a length direction of the fins 202. In some embodiments, a direction from the positive terminal 211 to the negative terminal 212 and the length direction of the fins 202 may have a non-zero angle.

Further, besides the projection of the metal layer 210 on the substrate 201 and the projection of the gate structure 203 on the substrate 201 may have a certain overlap, the projection of the metal layer 210 on the substrate 201 and the projection of the fins 202 on the substrate 201 may also have a certain overlap.

Thus, the portion of the metal layer 210 may be right above the gate structure 203; and may also be right above the fins 202 corresponding to the gate structure 203. When the FinFET device is in operation, for a single FinFET, the gate structure 203 right above the fins 202 may generate a sufficiently high heat by the self-heating effect. Thus, the thermal migration ability of the metal ions in the metal layer 210 may be further increased. Accordingly, the programing time of the semiconductor device may be further reduced.

The metal layer 210 may be made of any appropriate material, such as Cu, Al, or W, etc. In one embodiment, the metal layer 210 is made of Cu.

The dielectric layer may be made of any appropriate material, such as silicon oxide, silicon nitride, silicon oxynitride, or silicon oxycarbonitride, etc. In one embodiment, the dielectric layer is made of silicon oxide.

The dielectric layer may be formed between the FinFET device and the Fuse device, the unnecessary electrical connection between the FinFET device and the Fuse device may be avoided. Specifically, the dielectric layer may be formed on the side and top surfaces of the isolation structure 200, the fins 202 and the gate structure 203.

In one embodiment, the top surface of the dielectric layer may level with the top surface of the metal layer 210. In some embodiments, the top surface of the dielectric layer may be above, or below the top surface of the metal layer.

The thickness of the dielectric layer between the top surface of the gate structure 203 and the bottom surface of the metal layer 210 may be an appropriate value. If the thickness of the dielectric layer between the top surface of the gate structure 203 and the bottom surface of the metal layer 210 is too small, the meal layer 210 and the gate structure 203 may easily have a breakdown; and the metal layer 210 and the gate structure 203 may be electrically connected. If the thickness of the dielectric layer between the top surface of the gate structure 203 and the bottom surface of the metal layer 210 is too large, the thermal transfer path for the heat in the FinFET device to transfer to the metal layer 210 may be too long, the heat loss may be too large; and the heat received by the metal layer 210 may be relatively low.

Thus, in one embodiment, the thickness of the dielectric layer between the top surface of the gate structure 203 and the bottom surface of the metal layer 210 may be in a range of approximately 10 nm-5000 nm, such as 10 nm, 100 nm, 500 nm, 1500 nm, 3000 nm, or 5000 nm, etc.

In one embodiment, as shown in FIG. 2, the semiconductor device may also include a conductive layer 240. The conductive layer 240 and the metal layer 210 may be on a same layer, i.e., the conductive layer 240 and the metal layer 210 may be formed on a same surface. In one embodiment, the conductive layer 240 and the metal layer 210 may together be referred to an M1 layer. The conductive layer 240 may be electrically connected with the metal layer 210. Further, the projection of the conductive layer 240 on the substrate 210 and at least one source region 204 may have a certain overlap. The conductive layer 240 and the metal layer 210 may be made of a same material; and formed by a same process. In some embodiments, the conductive layer and the metal layer may be made of a same material; and may be formed by different processes. In other embodiments, the conductive layer and the metal layer may be made of different materials; and may be formed by a same process.

Further, the semiconductor device may also include a conductive plug (not shown) formed between the conductive layer 240 and the source region 204. The conductive plug may electrically connect the conductive layer 240 with the source region 204. By using the conductive layer 240 and the conducive plug, the electrical connection between the negative terminal 212 of the Fuse device and the source region 204 of the FinFET device may be formed.

In some embodiments, when the projection of the metal layer on the substrate and the source region have a partial overlap, the electrical connection between the negative terminal and the source region may be directly formed by the conductive plug.

The external pad 221 may be made of any appropriate material, such as Cu, Al, or W, etc. In one embodiment, the external pad 221 is made of Cu.

The external pad 221 may be used to connect the positive terminal 211 with other devices and external circuits. The external pad 221 may be formed on a same layer as the metal layer 210. The external pad may be made of a same material as that of the metal layer 210; and may be formed by a same process.

In some embodiments, the external pad may be formed in the layer above the metal layer. That is, the metal layer may be between the external pad and the FinFET device.

Further, as shown in FIG. 2, the semiconductor device may also include an interconnect structure 250. The interconnect structure 250 may be used to electrically connect the metal layer 210 with the external pad 221.

In one embodiment, a direction from the positive terminal 211 of the metal layer 210 to the negative terminal 212 of the metal layer 210 may be parallel to the length direction of the fins 202, i.e., a direction from the source region to a corresponding drain region. In some embodiments, the metal layer includes two terminals, one terminal may be referred to as a positive terminal, and the other terminal may be referred to as a negative terminal. The direction from the positive terminal to the negative terminal may be parallel to the length direction of the gate structure. That is, the direction from the positive terminal to the negative terminal may be perpendicular to the length direction of the fins. Specifically, the metal layer may be right above the gate structure such that the majority of the heat received by the metal layer may be from the heat generated by the gate structure due to the self-heating effect. Thus, the heat received by the metal layer may be sufficiently large; and the thermal migration ability of the metal ions in the metal layer may be relatively strong. Accordingly, the time for the metal layer to fuse may be relatively short.

In some embodiments, a portion of the metal layer may be right above both the gate structure and the fins corresponding the gate structure.

In the disclosed semiconductor device, the Fuse device may be right above the FinFET device; and the Fuse device may be made of metal. The positive terminal of the metal layer may be electrically connected to the external pad; and the negative terminal of the metal layer may be electrically connected to the source region of the FinFET device. When the FinFET device is in operation, the FinFET device may generate heat due to the self-heating effect. The heat may be transferred to the Fuse device above the FinFET device. Thus, the thermal migration of the metal ions in the metal layer may be speeded up. The time for the metal layer to fuse may be reduced. Thus, the programming time of the semiconductor device may be reduced; and the programming efficiency may be improved.

Figure 6:
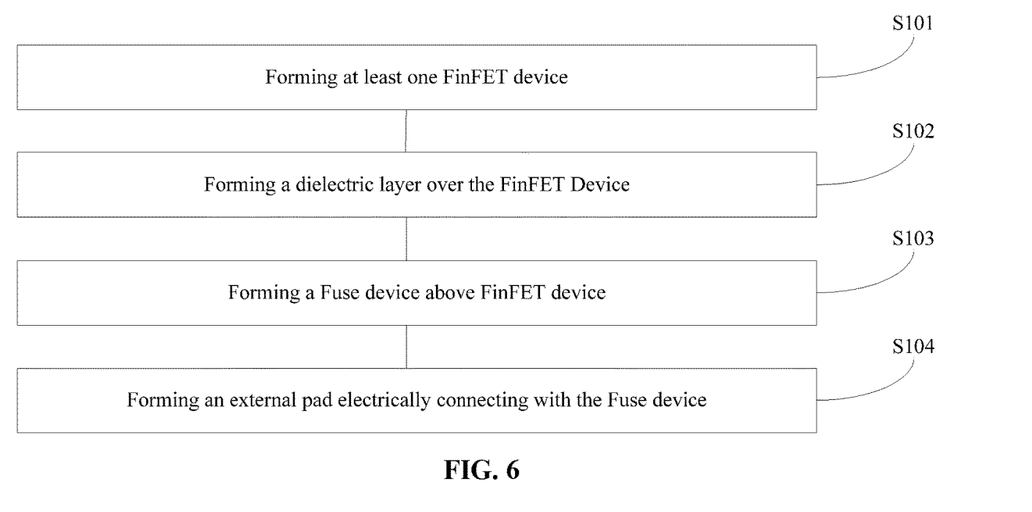
FIG. 6 illustrates an exemplary fabrication process of a semiconductor device consistent with the disclosed embodiments.

Correspondingly, the present disclosure provides a method for fabricating a semiconductor device. FIG. 6 illustrates an exemplary method for fabricating a semiconductor device consistent with the disclosed embodiments.

As shown in FIG. 6, the method may include forming at least one FinFET device (S101). The FinFET device may include a substrate, a plurality of fins protruding from the substrate, at least one gate structure formed over the substrate and across the fins by covering portions of side and top surfaces of the gate structure, and source/drain regions formed in the fins at two sides of the gate structure. The method may also include forming a dielectric layer on the gate structure, and the source/drain regions of the FinFET device (S102); and forming a Fuse device above the FinFET device (S103). The Fuse device may include a positive terminal and a negative terminal. The negative terminal of the Fuse device may be connected to at least one source region of the FinFET device. The dielectric layer may be between the FinFET device and the Fuse device. Further, the method may include forming an external pad electrically connecting with the positive terminal of the Fuse device (S104).

Specifically, before forming the Fuse device, the dielectric layer may be formed. The process for forming the Fuse device may include forming a metal layer on the dielectric layer. The metal layer may have two terminals. One terminal may be referred to as the negative terminal; and the other terminal may be referred to as the positive terminal.

The process for forming the metal layer may include forming a metal film on the dielectric layer; and patterning the metal film to form the metal layer. In one embodiment, the semiconductor device may also include a conductive layer formed on a same layer with the metal layer. That is, the conductive layer and the metal layer may be formed on a same surface. Correspondingly, the process for patterning the metal film may also be used to form the conductive layer.

In some embodiments, during the process for forming the dielectric layer, or after forming the dielectric layer, the conductive plug may also be formed. The conductive plug may be used to form an electrical connection between the conductive layer and the source region of the FinFET device.

In some embodiments, the process for forming the metal layer may include etching the dielectric layer to form a trench in the dielectric layer; and forming a metal layer to fill the trench. The metal layer may have two terminals. One terminal may be referred to as a negative terminal; and the other terminal may be referred to as a positive terminal. Correspondingly, during the process for forming the metal layer, the conductive layer may be also be formed on a same layer as the metal layer. Before forming the conductive layer or during the process for forming the conductive layer, the conductive plug electrically connecting the conductive layer with the source region of the FinFET device may be formed.

Figure 4:
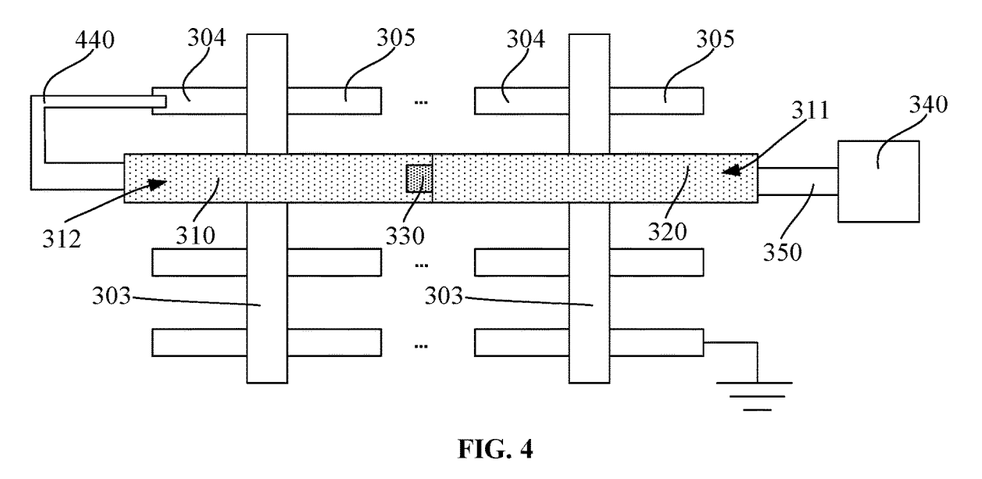
FIG. 4 illustrates a top view of another exemplary semiconductor device consistent with the disclosed embodiments.
Figure 5:
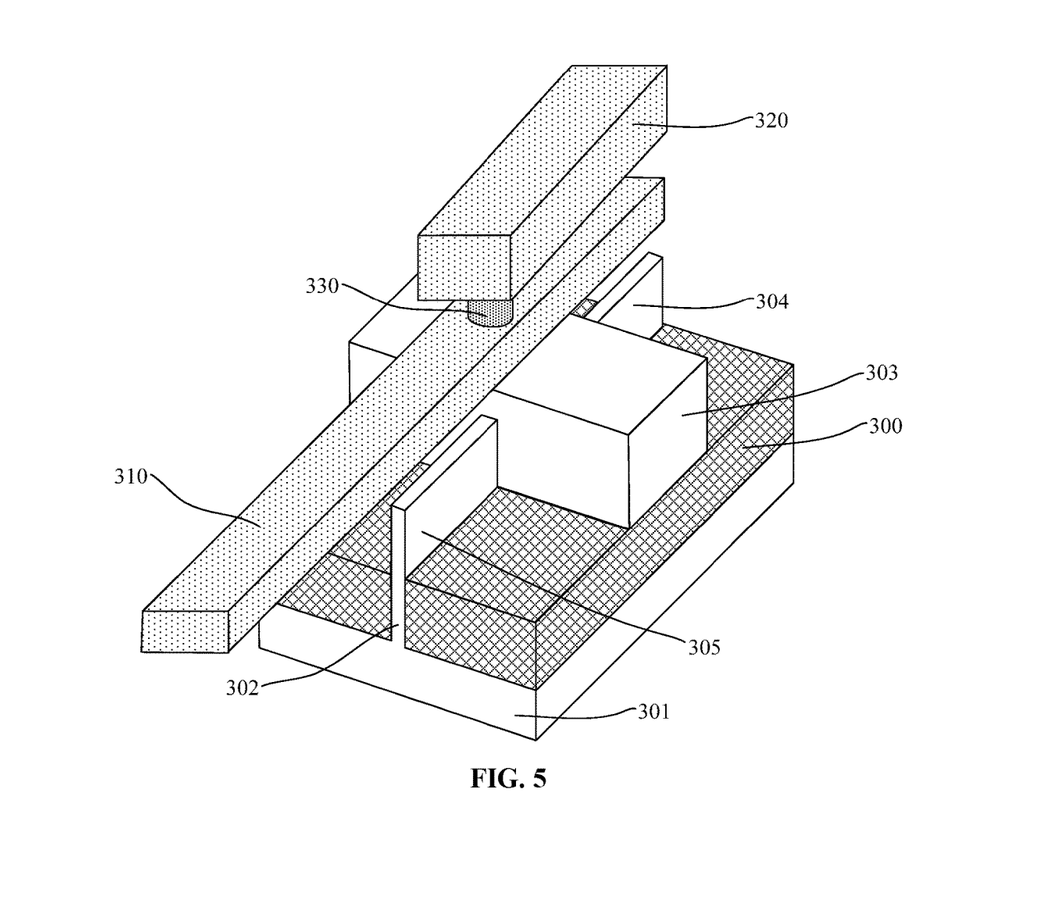
FIG. 5 illustrates a three-dimensional view of a portion of another exemplary semiconductor device consistent with the disclosed embodiments.

FIGS. 4-5 illustrate another exemplary semiconductor device consistent with the disclosed embodiments. FIG. 4 is a top view of the semiconductor device; and FIG. 5 is a three dimensional view of the structure illustrated in FIG. 4.

As shown in FIGS. 4-5, the semiconductor device may include at least one FinFET device. The FinFET device may include a substrate 301, a plurality of fins 302 protruding from the substrate 301, at least one gate structure 303 formed over the substrate 301 and across the plurality of fin 302 by covering portions of the side and top surfaces of the fins 302; and source regions 304 and drain regions 305 formed in the fins 302 at two sides of the gate structure 303. Four illustrative purposes, two gate structures 303 are illustrated herein.

Further, the semiconductor device may also include at least one Fuse device formed above the FinFET device. The Fuse device may have a positive terminal 311 and a negative terminal 312. The positive terminal 311 may be electrically connected to an external pad 340. The negative terminal 312 may be electrically connected to at least one source region 304 of the FinFET device.

Further, the semiconductor device may also include a dielectric layer (not shown) formed between the Fuse device and the FinFET device.

In one embodiment, an isolation structure 300 may be formed on the substrate 301. The isolation structure 300 may be on portions of the side surfaces of the fins 302; and the top surface of the isolation structure 300 may be below the top surfaces of the fins 302.

In one embodiment, the Fuse device may include a first metal layer 310 formed above the FinFET device, a second metal layer 320 formed above the first metal layer 310, and a first conductive plug 330 electrically connecting the first metal layer 310 with the second metal layer 320 formed between the first metal layer 310 and the second metal layer 320. The first metal layer 310 may be configured as the negative terminal 312; and the second metal layer 320 may be configured as the positive terminal 311.

The programming time of the semiconductor device may be dependent of the fusing time of the first conductive plug 330. The shorter the fusing time of the first conductive plug 330 is, the shorter the programming time of the semiconductor device is. Thus, more heat generated by the self-heating effect of the semiconductor device during the operation of the semiconductor device is expected to be applied to the first conductive plug 330.

The heat generated by the self-heating effect in the gate structure 303 may be sufficiently high. Thus, the projection of the first conductive plug 330 on the substrate 301 and the projection of the gate structure 303 on the substrate 301 may at least partially overlap. That is, a portion of the first conductive plug 330 may be right above the gate structure 303.

In one embodiment, the projection of the first conductive plug 330 on the substrate 301 and the projection of the fins 302 on the substrate 301 may also at least partially overlap Thus, a portion of the first conductive plug 330 may be right above the gate structure 303; and may also be right above the fins 302 corresponding to the gate structure 303.

Comparing with other regions, the portion of the gate structure 303 right above the fins 302 may generate higher heat by the self-heating effect. Thus, the heat received by the first conductive plug 303 from the FinFET device may be higher. Accordingly, the thermal migration ability of the metal ions in the first conductive plug 330 may be further improved; and the programming time of the semiconductor device may be further reduced.

In some embodiments, the first conductive plug may be only right above the gate structure, or may be only right above the fins.

The first conductive plug 330 may be made of any appropriate material, such as Cu, Al, or W, etc. In one embodiment, the first conductive plug 330 is made of Cu.

In one embodiment, the length direction of the first metal layer 310 may be parallel to the length direction of the fins 302. In some embodiments, the position of the first metal layer may be adjusted according to the requirements of the mask layout. For example, the length direction of the first metal layer and the length direction of the gate structure may be parallel. Or, the length direction of the first metal layer and the length direction of the fins may be have a greater than 0 and smaller than 90° angle.

In one embodiment, the length direction of the second metal layer 320 may be parallel to the length direction of the fins 302. In some embodiments, the position of the second metal layer may be adjusted according to the requirements of the mask layout. For example, the length direction of the second metal layer and the length direction of the gate structure may be parallel. Or, the length direction of the second metal layer and the length direction of the fins may be have a greater than 0 and smaller than 90° angle.

The first metal layer 310 may be made of any appropriate material, such as Cu, Al, or W, etc. In one embodiment, the first metal layer 310 is made of Cu.

The second metal layer 320 may be made of any appropriate material, such as Cu, Al, or W, etc. In one embodiment, the second metal layer 320 is made of Cu.

Further, as shown in FIG. 4, the semiconductor device may also include a conductive layer 440 formed on a same layer with the first metal layer 310. That is, the conductive layer and the first meta layer 310 may be formed on a same surface. The conductive layer 440 may electrically connect with the first metal layer 310. The projection of the conductive layer 440 on the substrate 301 and the source region 304 of the FinFET device may at least partially overlap.

Further, the semiconductor device may also include a second conductive plug (not shown) formed between the conductive layer 440 and the source region 304. The second conductive plug may electrically connect the conductive layer 440 with the source region 304.

In some embodiments, when the projection of the first metal layer on the substrate and the source region have a partial overlap, the electrical connection between first metal layer and the source region of the FinFET device may be directly formed by the second conductive plug. It is unnecessary to form the conductive layer.

The dielectric layer may be formed between the FinFET device and the Fuse device, the unnecessary electrical connection between the FinFET device and the Fuse device may be avoided. Specifically, the dielectric layer may be formed on the side and top surfaces of the isolation structure 300, the fins 302 and the gate structure 303.

In one embodiment, the top surface of the dielectric layer may level with the top surface of the second metal layer 320. In some embodiments, the top surface of the dielectric layer may be above, or below the top surface of the second metal layer.

The thickness of the dielectric layer between the top surface of the gate structure 303 and the bottom surface of the first conductive plug 330 may be an appropriate value. If the thickness of the dielectric layer between the top surface of the gate structure 303 and the bottom surface of the first conductive plug 330 is too small, the dielectric layer between the first conductive plug 330 and the gate structure 303 may be easy to have a breakdown; and the first conductive plug 330 and the gate structure 303 may be electrically connected. If the thickness of the dielectric layer between the top surface of the gate structure 303 and the bottom surface of the first conductive plug 330 is too large, the thermal transfer path for the heat in the FinFET device to transfer to the first conductive plug 330 may be too long, the heat loss may be too large; and the heat received by the first conductive plug 330 may be relatively low.

Thus, in one embodiment, the thickness of the dielectric layer between the top surface of the gate structure 303 and the bottom surface of the first conductive plug 330 may be in a range of approximately 10 nm-5000 nm, such as 10 nm, 100 nm, 500 nm, 1500 nm, 3000 nm, or 5000 nm, etc.

The external pad 340 may be made of any appropriate material, such as Cu, Al, or W, etc. In one embodiment, the external pad 340 is made of Cu.

The external pad 340 may be used to electrically connect the positive terminal 311 with other devices and external circuits. The external pad 340 may be formed on a same layer as the second metal layer 320. In one embodiment, the external pad 340 and the second metal layer 320 may be made of a same material; and may be formed by a same process. In some embodiments, the external pad and the second metal layer may be made of different material; and may be formed by different processes.

In some embodiments, the external pad may be formed in the layer above the second metal layer. That is, the second metal layer may be between the external pad and the FinFET device.

Further, as shown in FIG. 4, if the external pad 340 and the second metal layer 320 are formed on different layers, the semiconductor device may also include an interconnect structure 350. The interconnect structure 350 may be used to electrically connect the second metal layer 320 with the external pad 340.

In the disclosed semiconductor device, the Fuse device may be right above the FinFET device; and the Fuse device may have a first metal layer, a second metal layer formed above the first metal layer and a first conducive plug formed between the first metal layer the second metal layer. The first metal layer may be configured as a negative terminal; and may be electrically connected with at least one source region of the FinFET device. The second metal layer may be configured as a positive terminal; and may be electrically connected to the external pad. When the FinFET device is in operation, the FinFET device may generate heat due to the self-heating effect. The heat may be transferred to the Fuse device above the FinFET device. Thus, the thermal migration of the metal ions in the first conductive plug may be speeded up. The time for the first conductive plug to fuse may be reduced. Thus, the programming time of the semiconductor device may be reduced; and the programming efficiency may be improved.

Correspondingly, the present disclosure provides another method for fabricating a semiconductor device. The method may include forming at least one FinFET device. The FinFET device may include a substrate, a plurality of fins protruding from the substrate, at least one gate structure on the substrate and across the fins by covering portions of side and top surfaces of the gate structure, and source/drain regions formed in the fins at two sides of the gate structure. The method may also include forming a dielectric layer on the gate structure, and the source/drain regions of the FinFET device; and forming a Fuse device above the FinFET device. The Fuse device may include a positive terminal and a negative terminal. The negative terminal of the Fuse device may be electrically connected to at least one source region of the FinFET device. The dielectric layer may be between the FinFET device and the Fuse device. Further, the method may include forming an external pad electrically connecting with the positive terminal of the Fuse device.

Specifically, the dielectric layer may be a multiple-stacked structure. The process for forming the Fuse device may include forming a first dielectric layer on the FinFET device. The first dielectric layer may be on the substrate, the fins and the gate structure; and a top surface of the first dielectric layer may be above the top surface of the gate structure. The method may also include forming a first metal layer in or on the surface of the first dielectric layer. The first metal layer may be configured as the negative terminal. Further, the method may also include forming a second dielectric layer on the first dielectric layer and the first metal layer; and forming a first conductive plug in the second dielectric layer. Further, the method may also include forming a second metal layer in or on the second dielectric layer. The second metal layer may be electrically connected with the first conductive plug. The second metal layer may be configured as the negative terminal.

In the disclosed semiconductor device, the Fuse device may be right above the FinFET device; and the Fuse device may be made of metal; and may have a negative terminal and a positive terminal. The positive terminal of the metal layer may be electrically connected to the external pad; and the negative terminal of the metal layer may be electrically connected to at least one source region of the FinFET device. A dielectric layer may be formed between the FinFET device and the Fuse device. The FinFET device may be used as programming transistors. Because the Fuse device may be right above the FinFET device, when the FinFET device is in operation, the FinFET device may generate heat due to the self-heating effect. The heat may be transferred to the Fuse device above the FinFET device. Thus, the thermal migration of the metal ions in the metal layer may be speeded up. The time for the metal to fuse may be reduced. Thus, the programming time of the semiconductor device may be reduced; and the programming efficiency may be improved.

In some embodiments, the Fuse device may be a metal layer right above the FinFET device; and the projection of the metal layer on the substrate and the projection of the gate structure on the substrate may at lease overlap with each other. Thus, a portion of the metal layer may be right above the gate structure. Accordingly, the heat on the metal layer provided by the gate structure may be sufficiently high. The time for the metal layer to fuse may be reduced. Thus, the programming time of the semiconductor device may be reduced.

In other embodiments, the Fuse device may include a first metal layer right above the FinFET device, a second metal layer above the first metal layer and a first conductive plug between the first metal layer and the second metal layer, and electrically connecting the first metal layer with the second metal layer. The projection of the first conductive plug on the substrate and the projection of the gate structure on the substrate may at least overlap with each other. Thus, a portion of the first conductive plug or the entire first conductive plug may be right above the gate structure. Accordingly, the heat on the first conductive plug provided by the gate structure may be sufficiently high. The time for the first conductive plug to fuse may be reduced. Thus, the programming time of the semiconductor device may be reduced.

The above detailed descriptions only illustrate certain exemplary embodiments of the present disclosure, and are not intended to limit the scope of the present disclosure.

Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A semiconductor device, comprising: at least one FinFET device, including a substrate, a plurality of fins protruding from the substrate, at least one gate structure on the substrate and across the plurality of fins by covering portions of side and top surfaces of the plurality of fins, and source regions and drain regions formed in the plurality of fins at two sides of the gate structure; a Fuse device, the Fusing device being a metal layer formed above the FinFET device and including a positive terminal, a negative terminal, and a first conductive plug, the negative terminal being electrically connected to at least one source region of the FinFET device, the positive terminal being electrically connected to an external pad, and a vertical projection of the first conductive plug on the substrate and a vertical projection of a crossing between the fins and the gate structure on the substrate partially overlaps with each other, wherein a direction from the positive terminal to the negative terminal and an extension direction of the fins have an acute angle and a vertical projection of the metal layer on the substrate completely covers a vertical projection of at least one of the plurality of fins on the substrate; and a dielectric layer; formed between the FinFET device and the Fuse device.

2. The semiconductor device according to claim 1, wherein:
one terminal of the metal layer is configured as the negative terminal; and
another terminal of the metal layer is configured as the positive terminal.

3. The semiconductor device according to claim 2, wherein:
a direction from the positive terminal to the negative terminal is parallel to a length direction of the plurality of fins.

4. The semiconductor device according to claim 2, wherein:
vertical projections of the metal layer and the gate structure on the substrate at least partially overlap with each other.

5. The semiconductor device according to claim 4, wherein:
a vertical projection of the metal layer on the substrate and a vertical projection of the fins having the gate structure on the substrate at least partially overlap with each other.

6. The semiconductor device according to claim 2, wherein:
the metal layer is right above one fin.

7. The semiconductor device according to claim 2, wherein: the metal layer is right above the gate structure.

8. The semiconductor device according to claim 2, wherein:
the dielectric layer is formed between a top surface of the gate structure and a bottom surface of the metal layer, and
a thickness of the dielectric layer between the top surface of the gate structure and the bottom surface of the metal layer is in a range of approximately 10 nm-5000 nm.

9. The semiconductor device according to claim 2, further comprising:
a conductive layer electrically connecting with the metal layer and formed on a same layer with the metal layer, wherein vertical projections of the conductive layer and the at least one source region of the FinFET device on the substrate at least partially overlap with each other; and
a conductive plug electrically connecting the at least one source region with the conductive layer, wherein at least one drain region of the FinFET device corresponding to the at least one source region of the FinFET device is grounded.

10. The semiconductor device according to claim 1, wherein:
the Fuse device includes a first metal layer right above the FinFET device, a second metal layer above the first metal layer, and the first conductive plug electrically connecting the first metal layer with the second metal layer formed between the first metal layer and the second metal layer;
the first metal layer is configured as the negative terminal; and
the second metal layer is configured as the positive terminal.

11. The semiconductor device according to claim 10, wherein:
the vertical projection of the first conductive plug on the substrate and a vertical projection of the fins on the substrate at least partially overlap with each other.

12. The semiconductor device according to claim 10, further comprising: a dielectric layer formed between a top surface of the gate structure and a bottom surface of the first conductive plug, wherein a thickness of the dielectric layer between the top surface of the gate structure and the bottom surface of the first conductive plug Gina range of approximately 10 nm-5000 nm.

13. The semiconductor device according to claim 10, further comprising:
a conductive layer electrically connecting with the first metal layer and formed on a same layer with the first metal layer and with a vertical projection on the substrate having an overlap with a vertical projection of the at least one source region on the substrate; and
a second conductive plug electrically connecting the at least one source region with the conductive layer.

14. A method for fabricating a semiconductor device, comprising:
forming at least one FinFET device, the FinFET device including a substrate, a plurality of fins protruding from the substrate, at least one gate structure on the substrate and across the plurality of fins by covering portions of side and top surfaces of the plurality of fins, and source/drain regions formed in the plurality of fins at two sides of the gate structure;
forming a dielectric layer over the FinFET device, the dielectric layer being on the gate structure, the source/drain regions of the FinFET device;
forming a Fuse device above the FinFET device, the Fusing device being a metal layer, the Fuse device including a negative terminal, a positive terminal, and a first conductive plug, the negative terminal being electrically connected to at least one source region of the FinFET device, and the dielectric layer being between the FinFET device and the Fuse device, and a vertical projection of the first conductive plug on the substrate and a vertical projection of a crossing between the fins and the gate structure on the substrate partially overlaps with each other, wherein a direction from the positive terminal to the negative terminal and an extension direction of the fins have an acute angle and a vertical projection of the metal layer on the substrate completely covers a vertical projection of at least one of the plurality of fins on the substrate; and forming an external pad electrically connecting with the positive terminal.

15. The method according to claim 14, wherein forming the Fuse device comprises:

forming a metal layer having two terminals on the dielectric layer, one terminal being configured as the negative terminal and another terminal being configured as the positive terminal.

16. The method according to claim 14, wherein forming the Fuse device comprises:

forming a trench in the dielectric layer; and forming a metal layer having two terminals in the trench, one terminal being configured as the negative terminal and another terminal being configured as the positive terminal.

17. The method according to claim 14, the dielectric layer being a multiple-stacked structure, wherein forming the dielectric layer and the Fuse device comprises:

forming a first dielectric layer over the FinFET device;

forming a first metal layer on the first dielectric layer, the first metal layer being configured as the positive terminal;

forming a second dielectric layer on the first dielectric layer and the first metal layer;

forming the first conductive plug in the second dielectric layer; and forming a second metal layer on the second dielectric, the second metal layer being configured as the negative terminal and being connected with the first conductive plug.

18. The method according to claim 14, the dielectric layer being a multiple-stacked structure, wherein forming the dielectric layer and the Fuse device comprises:

forming a first dielectric layer over the FinFET device;

forming a first metal layer in the first dielectric layer, the first metal layer being configured as the negative terminal;

forming a second dielectric layer on the first dielectric layer and the first metal layer;

forming the first conductive plug in the second dielectric layer; and forming a second metal layer in the second dielectric layer, the second metal layer being configured as the positive terminal and being electrically connected with the first conductive plug.

19. The method according to claim 18, wherein:

the first conductive plug is right above the gate structure.

* * * * *